US011982947B2

(12) United States Patent
Derks et al.

(10) Patent No.: US 11,982,947 B2
(45) Date of Patent: May 14, 2024

(54) CONTAMINATION TRAP

(71) Applicant: ASML Netherlands B.V., Veldhoven (NL)

(72) Inventors: Sander Catharina Reinier Derks, Budel (NL); Daniel Jozef Maria Direcks, Simpelveld (NL); Maurice Wilhelmus Leonardus Hendricus Feijts, Beek (NL); Pieter Gerardus Mathijs Hoeijmakers, Veldhoven (NL); Katja Cornelia Joanna Clasina Moors, Eindhoven (NL); Violeta Navarro Paredes, Eindhoven (NL); William Peter Van Drent, Best (NL); Jan Steven Christiaan Westerlaken, Heesch (NL)

(73) Assignee: ASML NETHERLAND B.V., Veldhoven (NI)

( * ) Notice: Subject to any disclaimer, the term of this patent is extended or adjusted under 35 U.S.C. 154(b) by 0 days.

(21) Appl. No.: 18/070,155

(22) Filed: Nov. 28, 2022

(65) Prior Publication Data
US 2023/0091648 A1 Mar. 23, 2023

Related U.S. Application Data

(63) Continuation of application No. 17/603,687, filed as application No. PCT/EP2020/056344 on Mar. 10, 2020, now Pat. No. 11,556,067.

(30) Foreign Application Priority Data

Apr. 17, 2019 (EP) ..................... 19169778

(51) Int. Cl.
G03F 7/00 (2006.01)
H05G 2/00 (2006.01)

(52) U.S. Cl.
CPC ...... *G03F 7/70916* (2013.01); *G03F 7/70033* (2013.01); *G03F 7/70891* (2013.01); *H05G 2/005* (2013.01); *H05G 2/008* (2013.01)

(58) Field of Classification Search
CPC ............ G03F 7/70033; G03F 7/70891; G03F 7/70916; G03F 7/7095; H05G 2/005; H05G 2/008
See application file for complete search history.

(56) References Cited

U.S. PATENT DOCUMENTS 8,901,523 B1 12/2014 Ershov et al.
2009/0073401 A1 3/2009 Buis et al.
(Continued)

OTHER PUBLICATIONS

International Search Report and Written Opinion of the International Searching Authority directed to related International Patent Application No. PCT/EP2020/056344, dated Jun. 17, 2020; 9 pages.
(Continued)

Primary Examiner — Peter B Kim
(74) Attorney, Agent, or Firm — Sterne, Kessler, Goldstein & Fox P.L.L.C.

(57) ABSTRACT

A contamination trap for use in a debris mitigation system of a radiation source, the contamination trap comprising a plurality of vanes configured to trap fuel debris emitted from a plasma formation region of the radiation source; wherein at least one vane or each vane of the plurality of vanes comprises a material comprising a thermal conductivity above 30 W m$^{-1}$ K$^{-1}$.

19 Claims, 7 Drawing Sheets

(56) References Cited

U.S. PATENT DOCUMENTS

| | | |
|---|---|---|
| 2015/0138519 A1 | 5/2015 | Luijten |
| 2016/0209753 A1* | 7/2016 | Zhao .................. G03F 7/70916 |
| 2018/0376575 A1 | 12/2018 | Chien et al. |
| 2022/0197158 A1 | 6/2022 | Derks et al. |

OTHER PUBLICATIONS

International Preliminary Report on Patentability directed to related International Patent Application No. PCT/EP2020/056344, dated Sep. 28, 2021; 7 pages.

* cited by examiner

CONTAMINATION TRAP

CROSS-REFERENCE TO RELATED APPLICATIONS

This application is a continuation of U.S. application Ser. No. 17/603,687, filed Oct. 14, 2021, which is a national stage of International Application No. PCT/EP2020/056344, filed Mar. 10, 2020, which claims priority of EP application 19169778.8 which was filed on Apr. 17, 2019, and which are incorporated herein in their entireties by reference.

FIELD

The present invention relates to a contamination trap and associated apparatus, system and method.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic system may comprise one or more radiation sources, a beam delivery system and one or more lithographic apparatuses. The beam delivery system may be arranged to deliver EUV radiation from one or more of the radiation sources to each of the lithographic apparatuses.

The EUV radiation may be produced using a plasma. The plasma may be created, for example, by directing a laser beam at a fuel in the radiation source. The resulting plasma may emit the EUV radiation. A portion of the fuel may become fuel debris, which may accumulate or be deposited on or more components of the radiation source.

This may result in contamination of the one or more components of the radiation source, which may be difficult to clean. Contamination of one or more components of the radiation source may lead to a decrease in the performance of the radiation source, e.g. the quality or power of the produced EUV radiation, which in turn may lead to degradation of performance of an associated lithographic apparatus. Ultimately, this may lead to significant down-time of the lithographic apparatus whilst components of the radiation source are cleaned or replaced.

SUMMARY

According to a first aspect of the invention there is provided a contamination trap for use in a debris mitigation system of a radiation source, the contamination trap comprising a plurality of vanes configured to trap fuel debris emitted from a plasma formation region of the radiation source; wherein at least one vane or each vane of the plurality of vanes comprises a material comprising a thermal conductivity above 30 W m$^{-1}$ K$^{-1}$.

By providing at least one or each vane of the plurality of vanes with a material comprising a thermal conductivity above 30 W m$^{-1}$ K$^{-1}$, thermal properties of the contamination trap (e.g. the plurality of vanes or at least one vane or each vane of the plurality of vanes) may be improved. The thermal properties of the contamination trap may be considered to be improved relative to the thermal properties of a contamination trap including a plurality of vanes made of stainless steel, which has a thermal conductivity lower than 30 W m$^{-1}$ K$^{-1}$. The improved thermal properties of the contamination trap may facilitate maintaining a temperature of the contamination trap below a melting temperature of the fuel debris. Additionally or alternatively, the improved thermal properties of the vanes may allow for the production of radiation (e.g. EUV radiation) having a power above 200 W, such as for example up to 500 W, while preventing an increase in the contamination of one or more components of the radiation source.

The material may comprise a thermal conductivity above 100 W m$^{-1}$ K$^{-1}$.

The material may comprise a thermal conductivity below 500 W m$^{-1}$ K$^{-1}$.

The material may comprise a transition metal.

The material may comprise at least one of: molybdenum, a molybdenum compound, a molybdenum alloy, copper, a copper alloy and a copper compound.

The provision of at least one of: molybdenum, a molybdenum compound, a molybdenum alloy, copper, a copper alloy and a copper compound as the material may lead to the improved thermal properties of the contamination trap, as described above.

At least one vane or each vane of the plurality of vanes may comprise a first portion. At least one vane or each vane of the plurality of vanes may comprise a second portion.

The first portion of the at least one vane or each vane of the plurality of vanes may comprise a debris receiving surface. The debris receiving surface may be arranged to receive fuel debris emitted from the plasma formation region of the radiation source.

The first portion may be arranged to protrude or extend towards the plasma formation region. The first portion may be arranged on the second portion.

At least one vane or each vane of the plurality of vanes may comprise a further material. The first portion may comprise the material and/or the further material. The second portion may comprise the material.

The material and the further material may have substantially the same coefficient of thermal expansion. This may lead to a strong chemical and/or mechanical bond between the material and the further material. Additionally or alternatively, mechanical stresses between the material and the further material (e.g. at an interface between the material and the further material) may be reduced, for example when the plurality of vanes are exposed to heat, e.g. in use.

The material may comprise copper, a copper alloy or a copper compound. The further material may comprise an alloy or steel alloy.

The contamination trap, e.g. the plurality of vanes or at least one vane or each vane of the plurality of vanes, may comprise a thermal conductivity, such as for example an overall thermal conductivity, of about 140 W m$^{-1}$ K$^{-1}$ or above 140 W m$^{-1}$ K$^{-1}$.

According to a second aspect of the present invention there is provided a contamination trap for use in a debris mitigation system of a radiation source, the contamination trap comprising a plurality of vanes configured to trap fuel debris emitted from a plasma formation region of the radiation source; wherein at least one vane or each vane of the plurality of vanes comprises a material and/or a further material, the material comprising a thermal conductivity that is greater than a thermal conductivity of the further material.

By providing at least one or each vane of the plurality of vanes with a material and/or a further material, wherein the material may comprise a thermal conductivity that is greater than a thermal conductivity of the further material, thermal properties of the contamination trap (e.g. the plurality of vanes or at least one vane or each vane of the plurality vanes) may be improved. For example, the improved thermal properties of the contamination trap may facilitate maintaining a temperature of the contamination trap below a melting temperature of the fuel debris. Additionally or alternatively, the improved thermal properties of the vanes may allow for the production of radiation (e.g. EUV radiation) having a power above 200 W, such as for example up to 500 W, while preventing an increase in the contamination of one or more components of the radiation source.

The contamination trap of the second aspect may comprise any features of the contamination trap of the first aspect.

According to a third aspect of the present invention there is provided a contamination trap for use in a debris mitigation system of a radiation source, the contamination trap comprising a plurality of vanes configured to trap fuel debris emitted from a plasma formation region of the radiation source; wherein at least one vane or each vane of the plurality of vanes comprises a first portion and a second portion.

By providing at least one or each vane of the plurality of vanes with a first portion and a second portion, thermal properties of the contamination trap may be varied or adjusted (or variable or adjustable), e.g. by selecting a material of the first portion and/or second portion.

The first portion of the at least one vane or each vane of the plurality of vanes may comprise a debris receiving surface. The debris receiving surface may be arranged to receive fuel debris emitted from the plasma formation region of the radiation source.

The first portion may be arranged to protrude or extend towards the plasma formation region. The first portion may be arranged on the second portion.

At least one vane or each vane of the plurality of vanes may comprise a material.

At least one vane or each vane of the plurality of vanes may comprise a further material.

The first portion may comprise the material and/or the further material. The second portion may comprise the material.

The material may comprise a thermal conductivity that is greater than a thermal conductivity of the further material.

The material and the further material may have substantially the same coefficient of thermal expansion.

The material comprises copper, a copper alloy or a copper compound. The further material may comprise an alloy or steel alloy.

The contamination trap of the third aspect may comprise any features of the contamination trap of the first aspect and/or second aspect.

According to a fourth aspect of the present invention there is provided a debris mitigation system for use in a radiation source, the debris mitigation system comprising a contamination trap according to the first, second and/or third aspect; a heating arrangement for heating the plurality of vanes of the contamination trap; and a cooling arrangement for transporting heat that is generated as a result of the plasma formation away from the plurality of vanes of the contamination trap.

According to a fifth aspect of the present invention there is provided a radiation source for producing radiation comprising a fuel emitter for providing a fuel target to a plasma formation region; and a debris mitigation system according to the fourth aspect.

According to a sixth aspect of the present invention there is provided a lithographic system comprising a radiation source according to the fifth aspect; and a lithographic apparatus.

According to a seventh aspect of the present invention there is provided a method of manufacturing of a contamination trap for use in a debris mitigation system of a radiation source, the method comprising: forming a contamination trap comprising a plurality of vanes, wherein the plurality of vanes are arranged for trapping fuel debris emitted from a plasma formation region of the radiation source; and wherein at least one vane or each vane of the plurality of vanes comprises a material comprising a thermal conductivity above 30 W m$^{-1}$ K$^{-1}$.

The method may comprise one or more of: providing a preformed portion, the preformed portion comprising a further material; forming a plurality of openings or spaces in the preformed portion; arranging the material in at least one or each opening or space of the plurality of openings or spaces; enclosing at least part of at least one or each opening or space of the plurality of openings or spaces with an enclosing portion, the enclosing portion comprising the further material; and heating the preformed portion, the material and/or the enclosing portion to a temperature above a melting temperature of the material.

The material and the further material may have substantially the same coefficient of thermal expansion.

The material may comprise copper, a copper alloy or a copper compound. The further material may comprise an alloy or steel alloy.

According to an eighth aspect of the present invention there is provided a method of manufacturing of a contamination trap for use in a debris mitigation system of a radiation source, the method comprising: forming a contamination trap comprising a plurality of vanes, wherein the plurality of vanes are arranged for trapping fuel debris emitted from a plasma formation region of the radiation source; and wherein at least one vane or each vane of the plurality of vanes comprises a material and/or a further material, the material comprising a thermal conductivity that is greater than a thermal conductivity of the further material.

The method of the eighth aspect may comprise any features of the method of the seventh aspect.

According to a ninth aspect of the present invention there is provided a method of manufacturing of a contamination trap for use in a debris mitigation system of a radiation source, the method comprising: forming a contamination trap comprising a plurality of vanes, wherein the plurality of vanes are arranged for trapping fuel debris emitted from a plasma formation region of the radiation source; and wherein at least one vane or each vane of the plurality of vanes comprises a first portion and a second portion.

The method of the ninth aspect may comprise any features of the method of the seventh aspect and/or eighth aspect.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which:

FIG. 5 depicts a graph of a temperature of a contamination trap dependency on a heat load absorbed by the contamination trap, when the radiation source is on;

DETAILED DESCRIPTION

Figure 1:
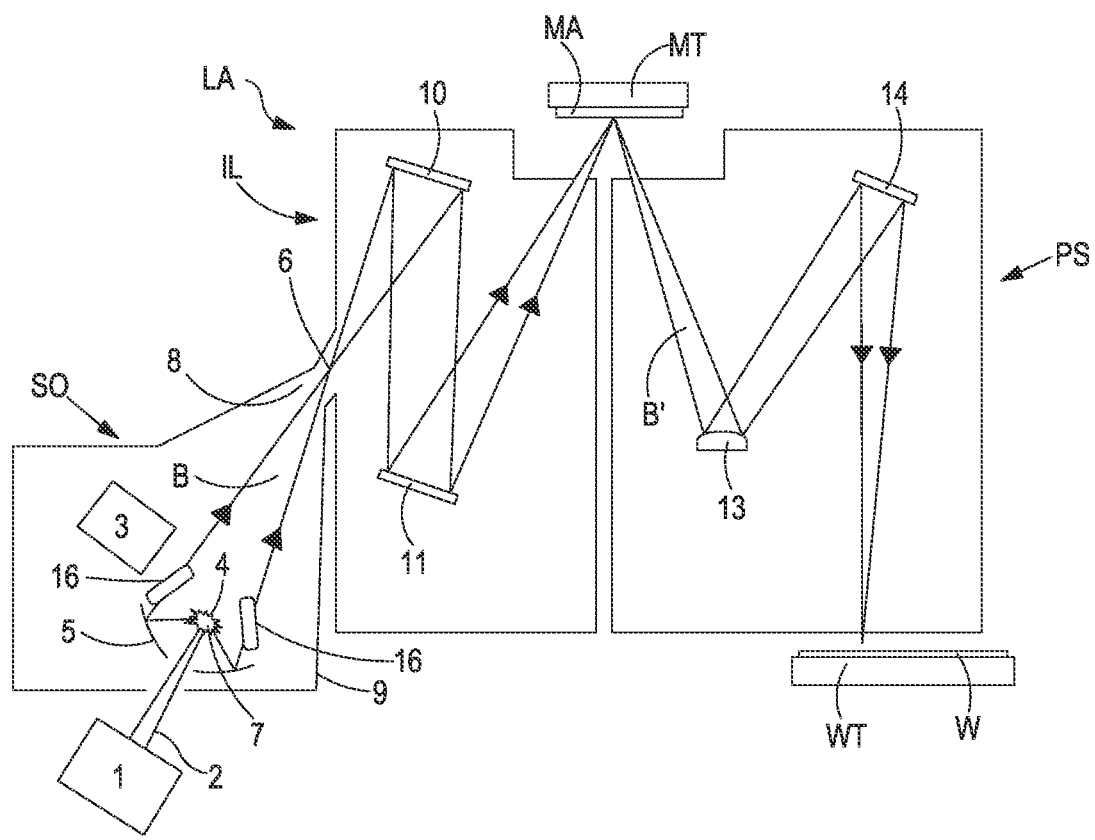
FIG. 1 depicts a lithographic system comprising a lithographic apparatus, a radiation source and a contamination trap for use in a debris mitigation system of the radiation source according to an embodiment of the invention.

FIG. 1 shows a lithographic system including a contamination trap 16 for use in a debris mitigation system of a radiation source SO according to one embodiment of the invention. The lithographic system comprises the radiation source SO and a lithographic apparatus LA. The radiation source SO is configured to generate an extreme ultraviolet (EUV) radiation beam B and to supply the EUV radiation beam B to the lithographic apparatus LA. The lithographic apparatus LA comprises an illumination system IL, a support structure MT configured to support a patterning device MA (e.g. a mask), a projection system PS and a substrate table WT configured to support a substrate W.

The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A relative vacuum, e.g. a small amount of gas (e.g. hydrogen) at a pressure well below atmospheric pressure, may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a collector 5. The collector 5 comprises, for example, a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam B. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B' enters the projection system PS. The projection system PS is configured to project the patterned EUV radiation beam B' onto the substrate W. The projection system comprises a plurality of mirrors 13, 14 which are configured to project the patterned radiation beam B' onto a substrate W held by the substrate table WT. The projection system PS may apply a reduction factor to the patterned radiation beam B', forming an image with features that are smaller than corresponding features on the patterning device MA. A reduction factor of 4 or 8 may for example be applied. Although the projection system PS has two mirrors 13, 14 in FIG. 1, the projection system may include any number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

The radiation source SO may comprise an on state, in which EUV radiation is produced. The radiation source SO may comprise an off state, in which no EUV radiation is produced. The radiation source may be operative between the on state and the off state.

Figure 2:
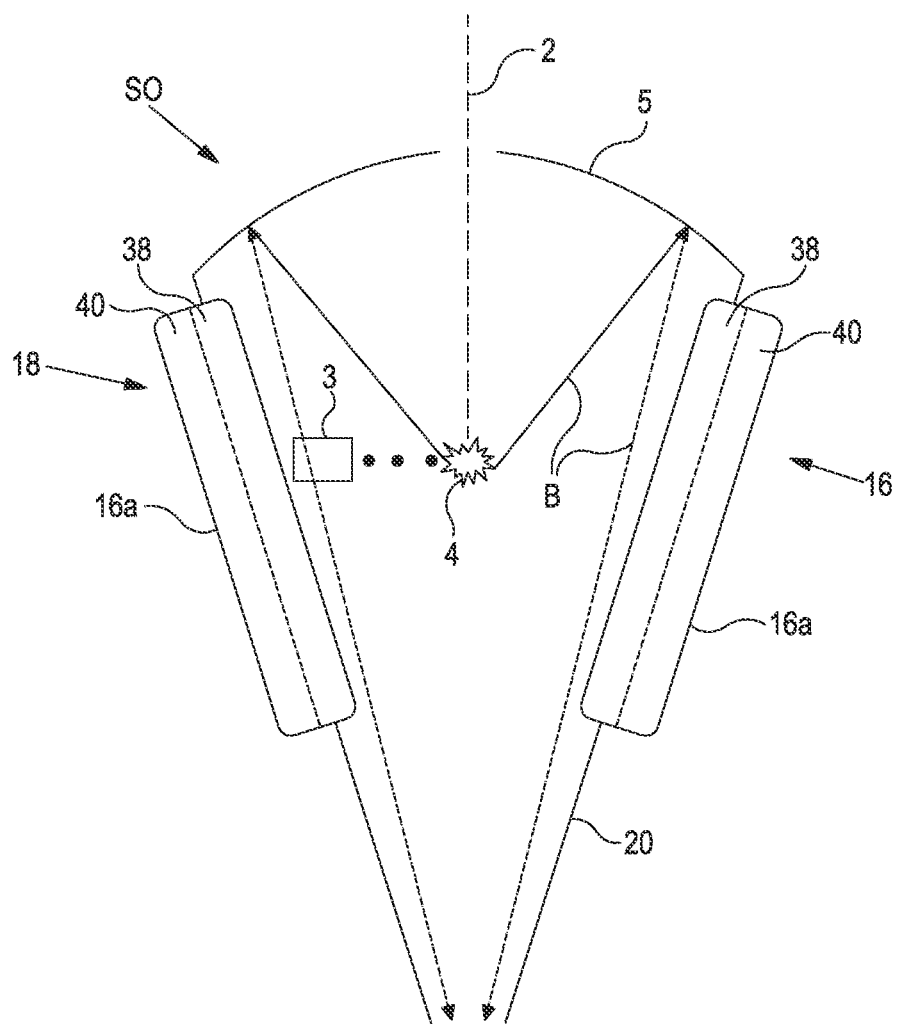
FIG. 2 depicts the contamination trap of FIG. 1.

FIG. 2 shows a contamination trap 16 for use in a debris mitigation system 18 of a radiation source SO according to an embodiment of the invention. The contamination trap 16 comprises a plurality of vanes 16a (two of which are shown in FIG. 2). The vanes 16a may be configured to trap fuel debris emitted from the plasma formation region 4 of the radiation source SO. The vanes 16a may be configured to allow for removal of the fuel debris from the vanes 16, e.g. towards a fuel collector (not shown). Fuel debris may include particulate debris, such as for example Sn clusters, Sn microparticles, Sn nanoparticles, and/or Sn deposits, molecular and/or atomic debris, such as for example Sn vapor, SnH$_x$ vapor, Sn atoms, Sn ions, e.g. when tin is used as a fuel.

The contamination trap 16 may be arranged so as to surround the plasma formation region 4. The radiation source SO may comprise a chamber 20. The contamination trap 16 may be part or comprised in the chamber 20. The contamination trap 16 may provide at least part of an inner wall of the chamber 20. The chamber 20 may have a conical shape. It will be appreciated that the chamber disclosed herein is not limited to having a conical shape. For example, in other embodiments the chamber may have a cylindrical or polyhedral shape or the like. The contamination trap 16 may comprise a shape of a truncated cone. It will be appreciated that the contamination trap disclosed herein is not limited to comprising a shape of a truncated cone. For example, in other embodiments the contamination trap may comprise a shape of a cylindrical or frustum or the like.

The vanes 16a may comprise a material comprising a thermal conductivity above 30 W m$^{-1}$ K$^{-1}$. By providing the vanes with a material comprising a thermal conductivity above 30 W m$^{-1}$ K$^{-1}$, thermal properties of the vanes and/or the contamination trap may be improved. For example, the improved thermal properties of the vanes and/or the contamination trap may facilitate maintaining a temperature of the vanes and/or the contamination trap below a melting temperature of the fuel debris. In examples where tin is used as a fuel, a temperature of the vanes and/or the contamination trap may be maintained below 200° C., which is below a melting temperature of about 230° C. of tin. This may prevent or reduce contamination of one or more components of the radiation source SO, such as for example the collector 5. At temperature above the melting temperature of the fuel, the fuel debris may become liquid and/or drip or be otherwise ejected on one or more components of the radiation source. The ejection of the liquid fuel debris may be referred to as spitting. The ejection of the liquid fuel debris may be due to the interaction between hydrogen radicals and the liquid fuel debris. For example, hydrogen (H$_2$) molecules may split into hydrogen radicals due to their absorption of heat and/or EUV radiation or ion collisions. Expressed differently, under the influence of, for example, the EUV radiation a hydrogen plasma may be formed in the radiation source SO. The hydrogen plasma may contain reactive species (H, H$^+$, or the like), which may be referred to as hydrogen radicals. The hydrogen radicals may remove, e.g. etch, fuel debris from one or more components of the radiation source, e.g. the collector 5. However, it has been found that some of the hydrogen radicals, such as for example H$^+$, may penetrate liquid fuel debris layers and form hydrogen bubbles inside the liquid fuel debris layers. The bubbles may breach the surface and on subsequent collapse of one or more bubbles, fuel debris, e.g. particulate fuel debris, may be ejected or emitted into the radiation source SO. This bubbling or spitting of liquid fuel debris may be considered as a major cause of contamination of one or more components of the radiation source, such as for example the collector 5.

Additionally or alternatively, the improved thermal properties of the vanes and/or contamination trap may allow for the production of EUV radiation having a power above 200 W, such as for example up to 500 W, while preventing an increase in the contamination of one or more components of the radiation source.

The material may comprise a thermal conductivity of above 50 W m$^{-1}$ K$^{-1}$, 70 W m$^{-1}$ K$^{-1}$ and/or 90 W m$^{-1}$ K$^{-1}$. For example, the material may comprise a thermal conductivity above 100 W m$^{-1}$ K$^{-1}$, 120 W m$^{-1}$ K$^{-1}$, 140 W m$^{-1}$ K$^{-1}$, 160 W m$^{-1}$ K$^{-1}$, 180 W m$^{-1}$ K$^{-1}$, 200 W m$^{-1}$ K$^{-1}$, 220 W m$^{-1}$ K$^{-1}$ and/or 240 W m$^{-1}$ K$^{-1}$. The material may comprise a thermal conductivity below 500 W m$^{-1}$ K$^{-1}$. For example, the material may comprise a thermal conductivity below 480 W m$^{-1}$ K$^{-1}$, 460 W m$^{-1}$ K$^{-1}$, 440 W m$^{-1}$ K$^{-1}$ and/or below 420 W m$^{-1}$ K$^{-1}$.

The material may be selected based on one or more parameter(s). The one or more parameter may comprise a corrosion resistance of the material, such as for example a resistance against corrosion due to the fuel and/or the environment in the radiation source SO, e.g. the hydrogen environment in the radiation source SO. The one or more parameter(s) may comprise a resistance of the material to the thermal loads acting on the vanes 16a, e.g. due to the radiation in the radiation source SO, the plasma 7 and/or an increase in the temperature of the vanes 16, e.g. to facilitate removal of fuel debris from the vanes 16a, as will be described below. The one or more parameter(s) may comprise an interaction of the material with hydrogen radicals, which may be present in the radiation source SO, as described above.

The material may comprise a metal or transition metal. For example, the material may comprise at least one of molybdenum, a molybdenum alloy or compound, copper, and a copper alloy or compound. Molybdenum may comprise a thermal conductivity of about 140 W m$^{-1}$ K$^{-1}$. Copper may comprise a thermal conductivity of about 400 W m$^{-1}$ K$^{-1}$.

Figure 3A:
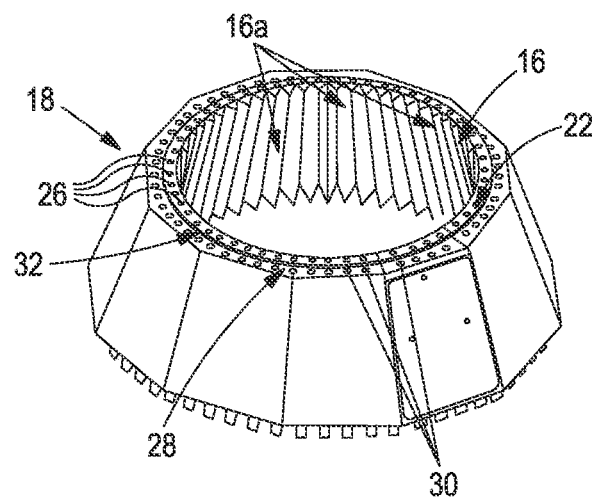
FIG. 3A depicts a debris mitigation system for use in a radiation source according to an embodiment of the invention.
Figure 3B:
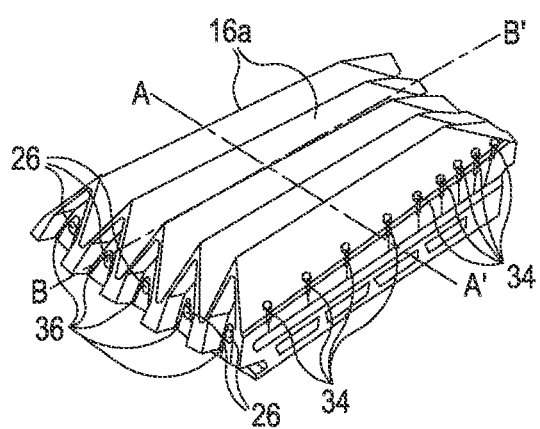
FIG. 3B depicts a part of the debris mitigation system of FIG. 3A.
Figure 3C:
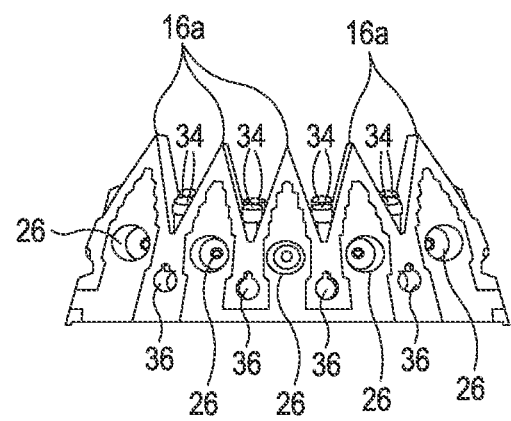
FIG. 3C depicts a sectional view of the part of the debris mitigation system along the line A-A' in FIG. 3B.
Figure 3D:
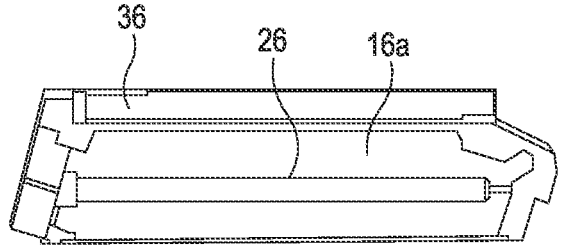
FIG. 3D depicts a sectional view of the part of the debris mitigation system along the line B-B' in FIG. 3B.

FIG. 3A shows a debris mitigation system 18 for use in a radiation source SO. FIG. 3B shows a part of the debris mitigation system 18 shown in FIG. 3A. FIG. 3C shows a sectional view of the part of the debris mitigation system 18 along the line A-A' in FIG. 3B. FIG. 3D shows a sectional view of the part of the debris mitigation system 18 along the line B-B' in FIG. 3B.

Referring to FIGS. 3A to 3D, the debris mitigation system 18 may comprise the contamination trap 16. The debris mitigation system 18 may comprise a heating arrangement 22 for heating the vanes 16a of the contamination trap 16. The heating arrangement 22 may be configured to heat the vanes 16a of the contamination trap 16, e.g. when the radiation source is off. For example, the heating arrangement 22 may heat the vanes 16a of the contamination trap 16 during maintenance operations of the radiation source SO, e.g. to allow for removal the fuel debris from the vanes 16a and/or other components of the radiation source SO. The heating arrangement 22 may be configured to heat the vanes 16a to a temperature above the melting temperature of the fuel debris. For example, when tin is used as a fuel, the heating arrangement 22 may be configured to heat the vanes to a temperature above 230° C., such as for example above 250° C., to keep the tin in a liquid state. This may facilitate the removal of fuel debris from the vanes 16a of the contamination trap 16. The heating arrangement 22 may comprise a plurality of heating elements, as will be described below. The debris mitigation system 18 may comprise a plurality of bores or channels 26. The bores or channels 26 may be part of or comprised in the contamination trap 16. For example, each vane 16a of the contamination trap may comprise a respective bore or channel 26. Each bore or channel 26 may be configured for receiving a respective heating element.

The debris mitigation system 18 may comprise a cooling arrangement 28 for transporting heat that is generated as a result of the plasma formation away from the vanes 16a of the contamination trap 16. When the radiation source SO is on, the cooling arrangement 28 may be configured to maintain the vanes 16a at a temperature below the melting temperature of the fuel debris. For example, when tin is used as a fuel, the cooling arrangement 28 may be configured to maintain a temperature of the vanes 16a below 230° C. The cooling arrangement 28 may comprise a plurality of coolant channels, as will be described below.

The debris mitigation system 18 may comprise a gap 32 between the heating arrangement 22 and the cooling arrangement 28. The cooling arrangement 28 may be in thermal communication with the vanes 16a via the heating arrangement 22 and the gap 32. In other words, heat may be transported from the vanes 16a via the heating arrangement 22 and the gap 32 to the cooling arrangement 28. As can best seen from FIG. 3A, the heating arrangement 22, the gap 32 and/or the cooling arrangement 28 may be concentrically arranged around the vanes 16a, e.g. the contamination trap 16.

The debris mitigation system 18 may be configured to direct a gas flow away from the vanes 16a. This may reduce an amount of fuel debris that may be deposited on the contamination trap 16, e.g. the vanes 16a. This in turn may increase a time period between maintenance operations of the radiation source SO, e.g. to remove the fuel debris from the vanes 16a and/or other components of the radiation source SO. The debris mitigation system 18 may comprise a plurality of nozzles 34. The nozzles 34 may be arranged to direct the gas flow away from the vanes 16a. For example, one or more nozzles 34 may be provided between at least two the vanes 16a. The debris contamination system 18 may comprise a plurality of further channels 36 for directing the gas flow to the nozzles 34. The gas flow may comprise hydrogen gas. However, it will be appreciated that in other embodiments other gasses may be used, such as for example argon or helium, or a gas mixture.

Figure 4A:
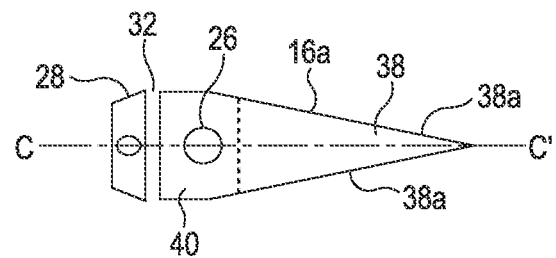
FIG. 4A depicts a plan view of an exemplary vane of the contamination trap of FIG. 2.
Figure 4B:
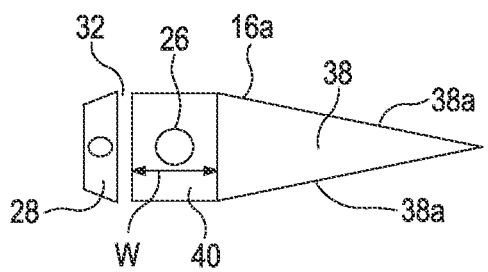
FIG. 4B depicts a plan view of an exemplary vane of the contamination trap of FIG. 2.
Figure 4C:
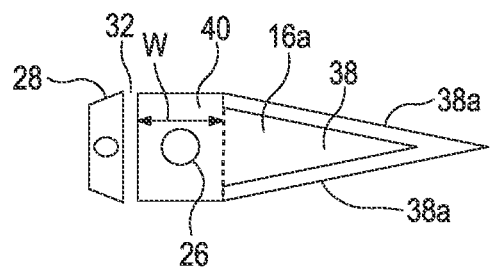
FIG. 4C depicts a plan view of an exemplary vane of the contamination trap of FIG. 2.

FIGS. 4A to 4C show plan views of exemplary vanes 16a of the contamination trap 16. Each of FIGS. 4A to 4C shows a part of the cooling arrangement 28 and a part of the gap 32 that may be associated with the respective vane 16a. Each vane 16a of the contamination trap 16 may comprise a first portion 38 and a second portion 40. The first portion 38 of each vane may comprise a debris receiving surface 38a arranged to receive fuel debris emitted from the plasma formation region 4 of the radiation source SO. The first portion 38 of each vane 16a may be arranged to protrude or extend towards the plasma formation region 4 (as indicated in FIG. 2). The first portion 38 of each vane 16a may be arranged on a respective second portion 40.

In the example shown in FIG. 4A, the first portion 38 and the second portion 40 of each vane 16a may each comprise the material. The dotted line in FIG. 4A is used for indication of the first portion 38 and second portion 40 of the vane 16a. In this embodiment the material may comprise a metal or transition metal, such as molybdenum or a compound or alloy thereof. The provision of molybdenum as the material may lead to improved thermal properties of the vanes 16a and/or the contamination trap 16. For example, the improved thermal properties of the vanes 16a and/or contamination trap 16 may facilitate maintaining a temperature of the vanes 16a and/or contamination trap 16 below a melting temperature of the fuel debris. In examples where tin is used as a fuel, a temperature of the vanes 16a and/or contamination trap 16 may be maintained below 200° C., which is below a melting temperature of about 230° C. of tin. This may prevent or reduce contamination of one or more components of the radiation source SO, such as for example the collector 5, e.g. due to spitting, as described above. Additionally or alternatively, the improved thermal properties of the vanes and/or contamination trap may allow for the production of EUV radiation having a power above 200 W, such as for example up to 500 W, while preventing an increase in the contamination of one or more components of the radiation source.

Referring to FIGS. 4B and 4C, each vane 16a may comprise a further material. The material may comprise a thermal conductivity that may be greater than a thermal conductivity of the further material. The further material may be selected based on at least one of the one or more parameter(s), described above. The material and the further material may have substantially the same coefficient of thermal expansion. This may lead to a strong chemical and/or mechanical bond between the material and the further material. Additionally or alternatively, mechanical stresses at the interface between the material and the further material may be reduced, for example when the vanes are exposed to heat when the radiation source is on.

In the example shown in FIG. 4B, the first portion 38 may comprise the further material and the second portion 40 may comprise the material. In this embodiment, the further material may comprise an alloy or steel alloy. For example, the further material may comprise stainless steel, such as for example AISI/SAE steel grade 316L, which may comprise about 2% Manganese (Mn), 16-18% Chromium (Cr), 8-13% Nickel (Ni) and 2% of Molybdenum (Mo). Stainless steel may have a coefficient of thermal expansion in the range of about $10 \times 10^{-6}$° $C.^{-1}$ to $18 \times 10^{-6}$° $C.^{-1}$. For example, AISI/SAE steel grade 316L may have a coefficient of thermal expansion of about $16 \times 10^{-6}$° $C.^{-1}$. In the example shown in FIG. 4B, the material may comprise copper or a compound or alloy thereof, such as for example oxygen-free copper (OFC) or oxygen-free high thermal conductivity (OFHC) copper. Oxygen-free copper or oxygen-free high thermal conductivity copper may comprise 0.001% Oxygen or less than 0.001% Oxygen. Copper, e.g. a copper alloy, may have a coefficient of thermal expansion in the range of about $16 \times 10^{-6\circ}$ C.$^{-1}$ to $21 \times 10^{-6\circ}$ C.$^{-1}$. The second portion 40 may have a width W in the range of 20 to 30 mm, such as for example 25 mm. The provision of oxygen-free copper or oxygen-free high thermal conductivity copper as the material and AISI/SAE steel grade 316L as the further material may lead to a strong chemical and/or mechanical bond between the material and the further material.

Vanes comprising copper or a compound or alloy thereof, such as for example oxygen-free copper or oxygen-free high thermal conductivity copper, as the material and stainless steel, such as for example AISI/SAE steel grade 316L, as the further materials may comprise a thermal conductivity, e.g. an overall thermal conductivity, of about 140 W m$^{-1}$ K$^{-1}$. During the manufacture of the contamination trap, as for example will be described below, the material, e.g. copper or a compound or alloy thereof, may be contaminated. This may lead to a varied, e.g. reduced, thermal conductivity of the material. For example, when the material is heated to above a melting temperature of material, one or more compounds of the further material, e.g. stainless steel, may diffuse into the material, thereby varying the thermal conductivity of the material. In this example, Nickel atoms may diffuse into the material, which may result in the thermal conductivity of copper (or a compound or alloy thereof) being lowered to about 240 W m$^{-1}$ K$^{-1}$. It will be appreciated that the material, e.g. copper or an alloy or compound thereof, disclosed herein is not limited to comprising a thermal conductivity of about 240 W m$^{-1}$ K$^{-1}$. In other embodiments, the thermal conductivity of copper or an alloy or compound thereof may be greater than 240 W m$^{-1}$ K$^{-1}$, such as for example about 400 W m$^{-1}$ K$^{-1}$, as described above. Additionally or alternatively, it will be appreciated that the contamination trap disclosed herein is not limited to comprising a thermal conductivity of about 140 W m$^{-1}$ K$^{-1}$. In other embodiments, the material may be selected and/or arranged such that the thermal conductivity, e.g. an overall thermal conductivity, of the contamination trap is above 30 W m$^{-1}$ K$^{-1}$, such as for example above 140 W m$^{-1}$ K$^{-1}$.

Experiments have shown that vanes comprising copper or an alloy or compound thereof as the material and stainless steel as the further material, for example as described above, may perform well when exposed to the hydrogen environment of the radiation source SO and/or hydrogen radicals. Expressed differently, by using copper or an alloy or compound thereof as the material and stainless steel as the further material, a recombination of the hydrogen radicals, which may occur when the hydrogen radicals interact with the vanes, may be improved. This may result in a decrease of spitting effects, described above. It will be appreciated that vanes comprising molybdenum as the material may perform in the same or a similar manner.

The exemplary vane 16a shown in FIG. 4C is similar to the exemplary vane 16a shown in FIG. 4B. The exemplary vane 16a shown in FIG. 4C may comprise any of the features of the exemplary vane 16a shown in FIG. 4B. The first portion 38 may comprise the material and the further material. The second portion 40 may comprise the material. The debris receiving surface 38a may comprise the further material. In other words, the first portion 38 may be considered as comprising the material, which may be at least partially enclosed by the further material.

Figure 4D:
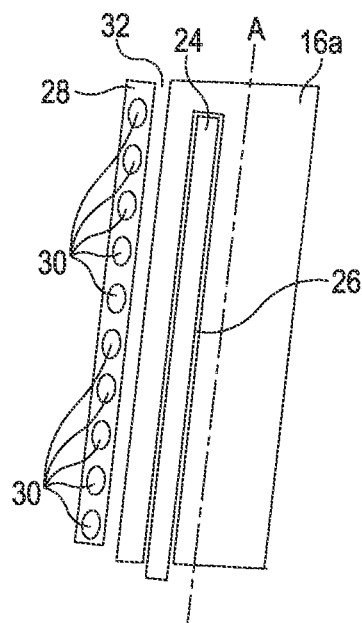
FIG. 4D depicts a sectional view of the vane along a line C-C' in FIG. 4A.

FIG. 4D shows a sectional view of the vane 16a along a line C-C' in FIG. 4A. As described above, the heating arrangement 22 may comprise a plurality of heating elements 24 (one of which is shown in FIG. 4D). Each vane 16a may comprise a respective bore or channel 26. A heating element 24 may be arranged in a respective bore or channel 26 of each vane 16a. The bore or channel 26 may extend in a direction along (e.g. substantially along) a central or longitudinal axis A of the vanes 16a. The bore or channel 26 may be comprised or arranged in the second portion 40 of the vane 16a.

As described above, the cooling arrangement 28 may comprise a plurality of coolant channels 30. The coolant channels 30 may be configured for receiving a coolant and/or transporting the coolant through the cooling arrangement 28. The coolant may be provided in the form of a coolant fluid, e.g. a coolant liquid, such as for example water, or a coolant gas/cold gas etc. In FIG. 4D a part of the cooling arrangement 28 is shown. The coolant channels 30 may be arranged to extend in a direction perpendicular (e.g. substantially perpendicular) to the longitudinal axis A of the vane 16a. It will be appreciated that any of the features of the vane 16a shown in FIG. 4D may be part of or comprised in the vane 16a shown in any one of FIGS. 4A to 4C.

Figure 5:
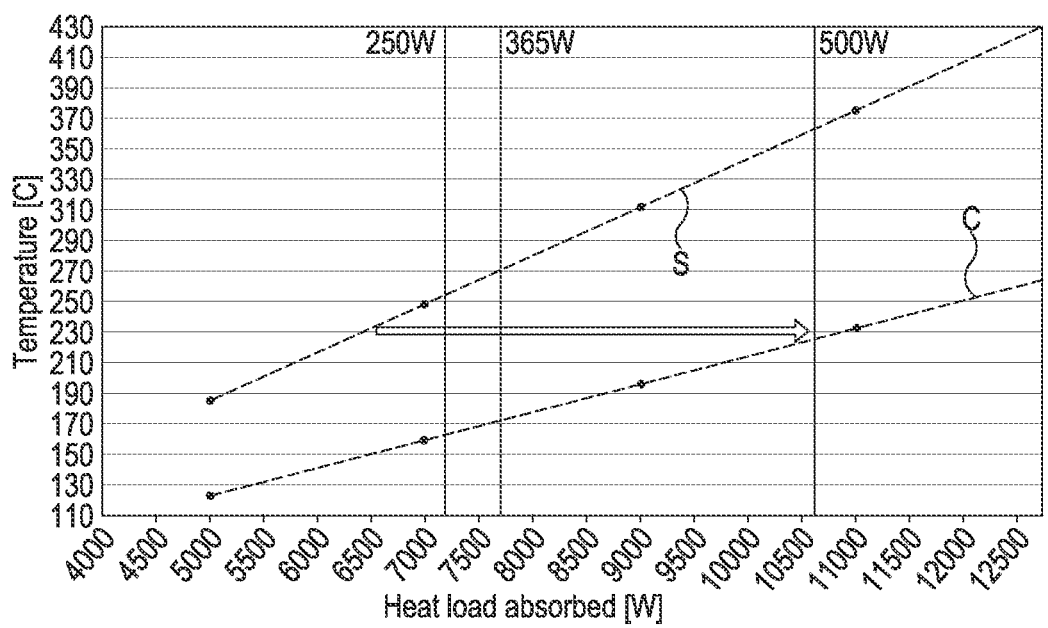

FIG. 5 shows a graph of a temperature of the debris mitigation system in dependency on a heat load absorbed by the debris mitigation system, e.g. the contamination trap, when the radiation source SO is on. The line indicated by the letter S in FIG. 5 represents the temperature of a debris mitigation system dependent on the heat load absorbed by the debris mitigation system, wherein the contamination trap comprises vanes made of stainless steel, such as for example AISI/SAE steel grade 316L. For absorbed heat loads greater than about 6,500 W, the temperature of the debris mitigation system, e.g. the contamination trap, increases to above 230° C., which may be considered as the melting temperature of the fuel in examples where tin is used. It can be seen in FIG. 5 that the heat load absorbed by the debris mitigation system, e.g. the contamination trap, increases to about 7,300 W for examples in which the EUV radiation produced by the radiation source has a power of about 250 W. Contamination of one or more components of the radiation source, such as for example the collector, may increase, when the temperature of the debris mitigation system, e.g. the contamination trap, increases to 230° C. or above (e.g. when tin is used as a fuel). This may be due to spitting effects, which may be present when the fuel melts and/or becomes liquid, as described above.

The line indicated by the letter C in FIG. 5 represents a temperature of a debris mitigation system dependent on the heat load absorbed by the debris mitigation system, e.g. the contamination trap, wherein the vanes comprise the material. In this example, the contamination trap may comprise a plurality of vanes 16a, as described in relation to FIG. 4C. It can be seen in FIG. 5 that the temperature of the debris mitigation system 18, e.g. the contamination trap 16, increases to above 230° C. for absorbed heat loads of greater than about 11,000 W. In other words, a debris mitigation system, e.g. a contamination trap, comprising vanes, which comprise the material, e.g. molybdenum or copper or a compound or alloy thereof, may absorb a greater heat load (e.g. about 1.7 times greater for the exemplary vane shown in FIG. 4C) before reaching a temperature of about 230° C. compared to a debris mitigation system, e.g. a contamination trap, comprising vanes made of stainless steel. The provision of the material may lead to improved thermal properties of the vanes 16a and/or the contamination trap 16. The improved thermal properties of the vanes 16a and/or contamination trap 16 may facilitate maintaining a temperature of the vanes below a melting temperature of the fuel debris. In examples where tin is used as a fuel, a temperature of the vanes 16a may be maintained below 200° C., which is below a melting temperature of about 230° C. of tin. This may prevent or reduce contamination of one or more components of the radiation source SO, such as for example the collector 5, e.g. due to spitting, as described above. Additionally or alternatively, the improved thermal properties of the vanes 16a and/or contamination trap may allow for the production of EUV radiation having a power above 200 W, such as for example up to 500 W, while preventing an increase in the contamination of one or more components of the radiation source.

As described above, fuel debris deposited on the contamination trap 16, e.g. the vanes 16a, may be removed during maintenance operations of the radiation source SO, e.g. when the radiation source SO is off. The heating arrangement 22 may be operative to heat (e.g. reheat) the vanes 16a to a temperature of above the melting temperature of the fuel debris, e.g. above 230° C. when tin is used as the fuel. Fuel debris deposited on the contamination trap 16, e.g. the vanes 16a, may melt and/or become liquid. The vanes 16a may be configured to provide one or more flow paths for the melted fuel debris, e.g. to allow the melted fuel debris to flow towards the fuel collector. The vanes 16a may comprise one or more grooves or channels (not shown) for guiding the melted fuel debris towards and/or into the fuel collector. The grooves or channels may be configured to provide the flow paths for the melted fuel. The grooves or channels may also be referred to as guiding gutters. The fuel collector may be provided in the form of a fuel bucket or the like. The fuel collector may be replaced regularly, e.g. when the fuel collector is full. As described above, the heating arrangement 22 may comprise a plurality of heating elements 24. Each heating element 24 may be associated with a respective vane 16a. Each heating element 24 may be configured to heat at least the associated vane 16a. When for example a heating element 24 becomes defective, an adjacent heating element 24 may be operative to heat the respective adjacent vane 16a and the vane 16 that is associated with the defective heating element 24. In examples where the contamination trap comprises vanes made of stainless steel, a heating element may be operative to heat one or two adjacent vanes that may be associated with respective defective heating elements, e.g. to maintain a temperature of the vanes above the melting temperature of the fuel. In examples where the contamination trap comprises vanes 16a comprising the material, as described above in relation to FIGS. 4A to 4D, a heating element 24 may be operative to heat more than two adjacent vanes that may be associated with respective defective heating elements, e.g. to maintain a temperature of the vanes above the melting temperature of the fuel. Expressed differently, more than two heating elements may be allowed to become defective, when the vanes 16a of the contamination trap 16 comprise the material. This may be due to the improved thermal properties, e.g. the increased thermal conductivity, of the contamination trap 16, e.g. the vanes 16a. For example, when at least the second portion 40 comprises the further material, e.g. copper or a compound or alloy thereof, a heating element may be operative to heat four adjacent vanes that may be associated with respective defective heating elements.

Figure 6:
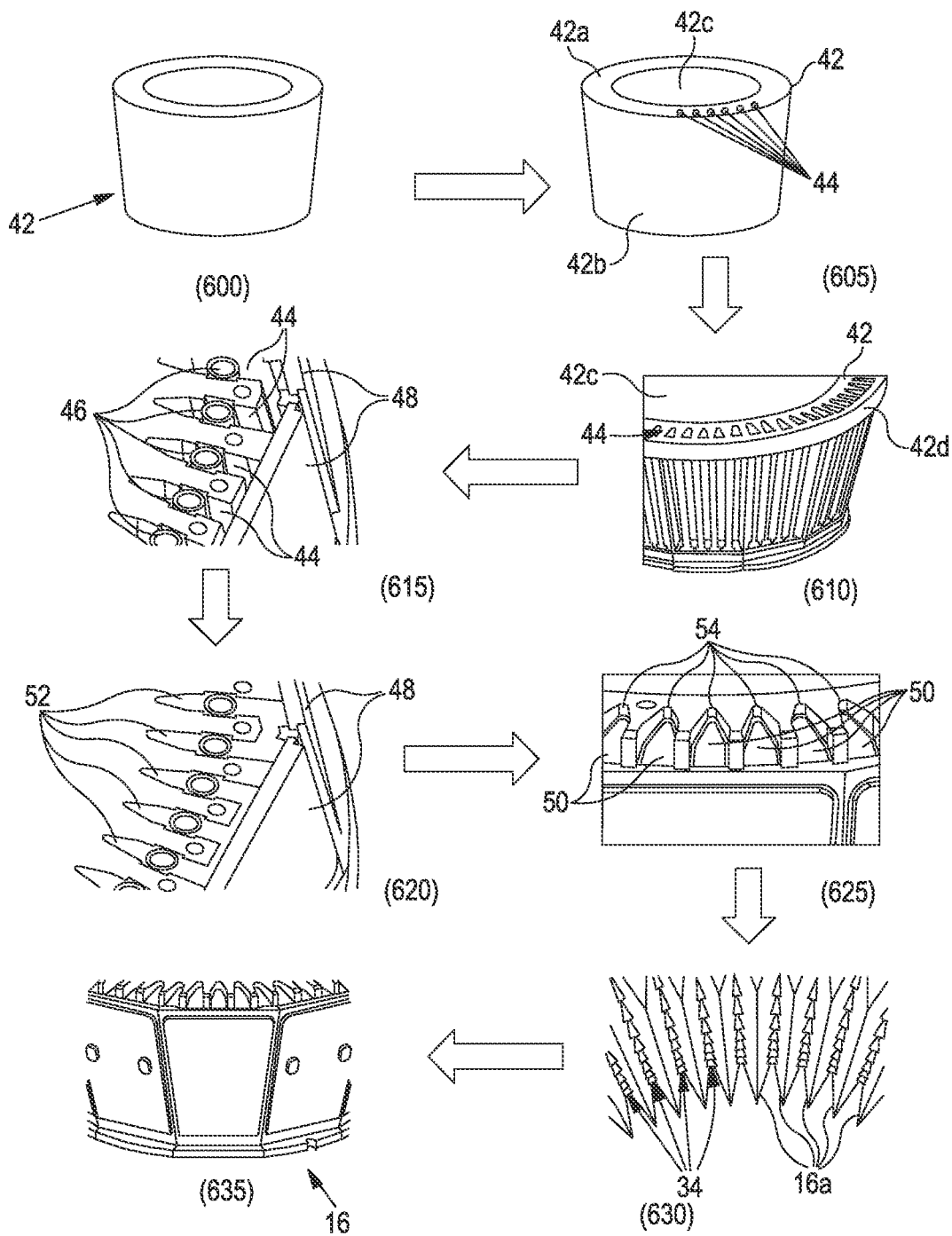
FIG. 6 depicts an exemplary process flow of a method of manufacturing of a contamination trap for use in a debris mitigation system of a radiation source.

FIG. 6 shows an exemplary process flow of a method of manufacturing of a contamination trap for use in a debris mitigation system of a radiation source. The method may comprise forming a contamination trap 16 comprising a plurality of vanes 16a. The vanes 16a are configured to trap fuel debris emitted from the plasma formation region 4 of the radiation source SO. Each vane 16a may comprise a material comprising a thermal conductivity above 30 W m$^{-1}$ K$^{-1}$.

The method may comprise providing a preformed portion of the contamination trap 16 (step 600). The preformed portion 42 may be formed from or comprise the further material. In this example, the further material may comprise stainless steel, such as for example AISI/SAE steel grade 316L. The preformed portion 42 may be formed using a manufacturing process, such as for example casting. In this example, the preformed portion 42 may be provided in the shape of a hollow truncated cone. It will be appreciated that in other embodiments the preformed portion may comprise a different shape, such as for example in the shape of a tubular, hollow frustum or the like. It will also be appreciated that in other embodiments the preformed portion may comprise or be formed from another material comprising a thermal conductivity of above 30 Wm$^{-1}$K$^{-1}$, such as for example molybdenum or a compound or alloy thereof.

The method may comprise forming a plurality of openings or spaces 44 in the preformed portion 42 (steps 605). Although in step 605 of FIG. 6 six openings or spaces 44 are shown, it will be appreciated that more than six openings or spaces may be formed. The openings or spaces 44 may be formed using a cutting process, such as for example drilling or the like. The openings or spaces 44 may be radially arranged in a wall 42a of the preformed portion. The openings or spaces 44 may be arranged to extend into the wall 42a of the preformed portion 42. The wall 42a may surround the plasma formation region 4, e.g. when the contamination trap 16 is arranged as part of the chamber 20 of the radiation source SO. The openings or spaces 44 may be arranged to extend into the wall 42a in a direction parallel (e.g. substantially parallel) to an outer surface 42b and/or an inner surface 42c of the wall 42a.

The method may comprise removing one or more portions of the outer surface 42b of the wall 42a, e.g. such that the spaces or openings 44 are exposed and/or uncovered (step 610). The one or more portions of the outer surface 42b of the wall 42 may be removed using a material removal process, such as for example milling or the like. One or more portions 42d of the outer surface 42b of the preformed portion 42 may remain.

The method may comprise arranging the material in each opening or space 44 (step 615). The material may be provided in one or more pre-shaped portions (not shown). Each pre-shaped portions may be shaped to match or complement a shape of a respective opening or space 44. The method may comprise arranging a plurality of elongate tubular portions 46 in the preformed portion 42. For example, each elongate tubular portion 46 may be arranged in a respective opening or space 44. The tubular portions 46 may be arranged to form the bores or channels 26, in which the heating elements 24 may be arranged. The method may comprise enclosing at least part of the openings or spaces 44 with one or more enclosing portions 48. Each enclosing portion 48 may comprise the further material. The enclosing portions 48 may be circumferentially arranged on the preformed portion 42. The enclosing portion 48 may be arranged to form at least part of an outer surface of the contamination trap 16. At least another part of the outer surface of the contamination trap 16 may be formed by the remaining portions 42d of the outer surface 42b of the preformed portion 42. The enclosing portions 48 and/or the remaining portions 42d may be joined together, for example using a welding process, such as for example electron beam welding or the like.

The method comprises heating the preformed portion 42, the material and/or the enclosing portions 48 (step 620). The preformed portion 42, material and/or the enclosing portions 48 may be heated to a temperature above the melting temperature of the material. In this example, the material may comprise copper or a compound or alloy thereof. Copper may have a melting temperature of about 1085° C. The preformed portion 42, the material and/or the enclosing portions 48 may be heated to a temperature above 1085° C., such as for example about 1100° C., to melt the material. The preformed portion 42 may be considered as acting as a mold for the material. By using the preformed portion as a mold for the material, the manufacture of the contamination trap may be facilitated. Additionally or alternatively, leakage of the molten material may be reduced by arranging the material in the preformed portion, e.g. the spaces or openings 44 thereof, for example compared to other processes, such as for example casting and/or brazing. The method disclosed herein may lead to a reduction of the time, costs and/or the number of steps required to manufacture a contamination trap.

The melted material may form a diffusion layer with the further material. This may result in a chemical, mechanical and/or thermal bond between the material and the further material. A depth of the diffusion layer may be varied by varying the temperature used for heating the preformed portion 42, the material and/or the enclosing portions 48. Each opening or space 44 may be formed or shaped such that at least part of the first portion 38 and/or the second portion 40 of a vane 16a may be formed therein, e.g. subsequent to arranging and/or heating the material therein.

In step 625, the method may comprise enclosing the material. For example, the method may comprise fully enclosing the material, e.g. with one or more further enclosing portions 50. The method may comprise arranging the further enclosing portions 50 on one or more uncovered portions 52 of the material, e.g. such that the material is fully enclosed by the enclosing portions 48 and/or the further enclosing portions 50. This may protect may protect the material from corrosion, e.g. when the contamination trap is used in the radiation source. For example, interaction between the material and fuel debris in the environment of the radiation source SO may lead to corrosion of the material. The further enclosing portions 50 may be arranged in respective further spaces 54. The further spaces 54 may be formed in the preformed portion 42. e.g. prior to arranging the further enclosing portions 50 therein, e.g. using a material removal process, such as for example milling or the like. Each further space 54 may be formed so as to surround a respective exposed or uncovered portion 52 of the material. A shape of each further enclosing portion 50 may match and/or complement a shape of each respective further space 54.

The method may comprise forming the plurality of vanes 16a (step 630). The plurality of vanes 16 may be formed from the inner surface 42c of the wall 42a of the preformed portion 42. The plurality of vanes 16a may be formed using a material removal process, such as for example milling or the like. For example, one or more portions of the inner surface 42c of the wall 42a may be removed, e.g. using the material removal process, to form the vanes 16a. One or more nozzles 34 may be arranged between at least two vanes 16a.

An example of a formed contamination trap 16 is shown in step 635. The method may comprise one or more treating, e.g. chemically treating, steps. The one or more treating steps may comprise a pickling process and/or a passivation process. One or more treating steps may be used throughout the method, e.g. prior or subsequent to one or more steps of the method described above. The method may comprise depositing a protective layer, such as for example a layer of tin on the vanes 16a. The protective layer may be deposited on the vanes 16a using an electrochemical process. The method may comprise removing at least part of the protective layer from the vanes 16a. Some of the protective layer may remain on the vanes 16a, e.g. to prevent oxidation of the vanes 16a (or a surface thereof) and/or to improve the wettability of the vanes 16a for fuel debris, e.g. fuel droplets, in use. The protective layer may be deposited and/or at least a part of the protective layer may be removed prior to installation of the contamination trap 16 in the radiation source SO.

It will be appreciated that the above method may be used to manufacture a contamination trap 16 comprising vanes 16a as shown in FIGS. 4B and 4C, or a combination thereof.

It will be appreciated that the order of the method steps may be different. One or more of the method steps may be used in isolation of each other or in a different combination. It will be appreciated that in some embodiment some of the method steps described above may be used in isolation or in combination with other method steps.

Figure 7:
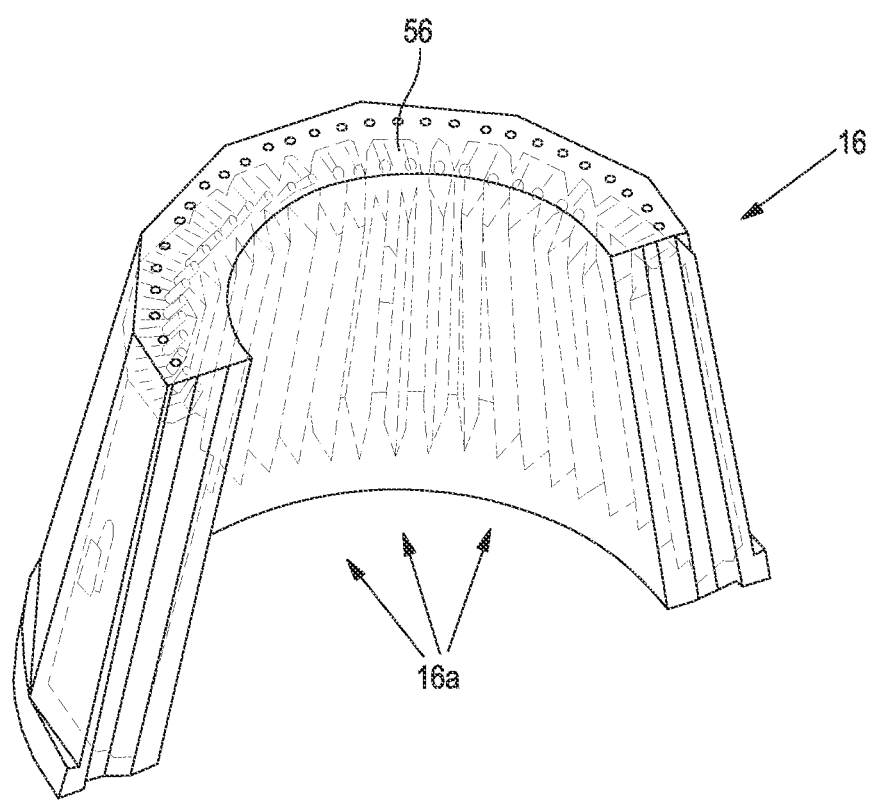
FIG. 7 depicts a part of a contamination trap, which may be manufactured using the process flow depicted in FIG. 6.

FIG. 7 shows a part of a contamination trap 16 comprising the vanes 16a. The contamination trap 16 shown in FIG. 7 may be manufactured using the process flow depicted in FIG. 6. In this example, each vane 16a may comprise the material and the further material. Each vane 16 may be the same or similar to the exemplary vane shown in FIG. 4C. The material may be considered as forming a core 56. The further material may be arranged to enclose the core 56.

It will be understood that references to a plurality of features may be interchangeably used with references to singular forms of those features, such as for example "at least one" and/or "each". Singular forms of a feature, such as for example "at least one" or "each," may be used interchangeably.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A contamination trap comprising:
a plurality of vanes arranged to form a truncated cone, a tube, or a hollow frustum, with a central longitudinal axis and defining an internal surface of the contamination trap, each vane comprising a first portion and a second portion,
wherein the first portion comprises a surface;
wherein the first portion has a vertex that extends away from the second portion and points toward the central longitudinal axis;
wherein at least one vane comprises a material and a further material;
wherein the material and the further material form a diffusion layer;
wherein the material and the further material have substantially the same rate of thermal expansion and the material comprises a thermal conductivity greater than a thermal conductivity of the further material;
wherein the surface of the first portion comprises the further material; and
wherein the contamination trap is configured to trap fuel debris emitted from a plasma formation region of a radiation source.

2. The contamination trap of claim 1, wherein the second portion comprises a material and the first portion comprises the material and a further material that at least partially encloses the material thereby forming a debris receiving surface configured to receive fuel debris emitted from the plasma formation region.

3. The contamination trap of claim 2, wherein the material is molybdenum, a molybdenum alloy, a molybdenum compound, copper, a copper alloy, or a copper compound.

4. The contamination trap of claim 2, wherein a chemical, mechanical and/or thermal bond exists between the material and the further material.

5. The contamination trap of claim 1, wherein the vanes comprise a material with a thermal conductivity above 30 W m−1 K−1.

6. The contamination trap of claim 1, wherein the vanes comprise a material with a thermal conductivity above 100 W m−1 K−1.

7. The contamination trap of claim 1, wherein the vanes comprise a material with a thermal conductivity below 500 W m−1 K−1.

8. The contamination trap of claim 1, wherein the material is copper, a copper alloy or a copper compound and/or the further material comprises an alloy or steel alloy.

9. The contamination trap of claim 1, further comprising a heating arrangement configured to heat the vanes.

10. The contamination trap of claim 1, further comprising a cooling arrangement configured to transport heat that is generated as a result of plasma formation away from the vanes.

11. A radiation source for producing radiation comprising:
a fuel emitter configured to provide a fuel target to a plasma formation region; and
a debris mitigation system comprising a contamination trap having a plurality of vanes arranged to form a truncated cone, a tube, or a hollow frustum, with a central longitudinal axis and defining an internal surface of the contamination trap, each vane comprising a first portion and a second portion,
wherein the first portion has a surface;
wherein the first portion has a vertex that extends away from the second portion and points toward the central longitudinal axis,
wherein at least one vane comprises a material and a further material;
wherein the material and further material form a diffusion layer;
wherein the material and the further material have substantially the same rate of thermal expansion and the material comprises a thermal conductivity that is greater than a thermal conductivity of the further material;
wherein the surface of the first portion comprises the further material; and
wherein the contamination trap is configured to trap fuel debris emitted from the plasma formation region.

12. The radiation source according to claim 11, wherein the second portion comprises a material and the first portion comprises the material and a further material that at least partially encloses the material thereby forming a debris receiving surface configured to receive fuel debris emitted from the plasma formation region.

13. The radiation source of claim 12, wherein the material is molybdenum, a molybdenum alloy, a molybdenum compound, copper, a copper alloy, or a copper compound.

14. The radiation source of claim 11, wherein the vanes comprise a material with a thermal conductivity above 30 W m−1 K−1.

15. The radiation source of claim 11, wherein the material is copper, a copper alloy or a copper compound and/or the further material comprises an alloy or steel alloy.

16. The radiation source of claim 11, further comprising a heating arrangement configured to heat the vanes.

17. The radiation source of claim 11, further comprising a cooling arrangement configured to transport heat that is generated as a result of plasma formation away from the vanes.

18. A manufacturing method, comprising:
generating extreme ultraviolet light using an extreme ultraviolet light generation apparatus;
emitting the extreme ultraviolet light to an exposure apparatus; and
exposing a photosensitive substrate to the extreme ultraviolet light in the exposure apparatus to produce an integrated circuit, integrated optical systems, guidance and detection patterns for magnetic domain memory, a flat-panel display, a liquid-crystal display, or a thin film magnetic head;
wherein the extreme ultraviolet light generation apparatus includes a radiation source configured to produce radiation, the radiation source comprising:
a fuel emitter configured to provide a fuel target to a plasma formation region; and
a debris mitigation system comprising a contamination trap having a plurality of vanes arranged to form a truncated cone, a tube, or a hollow frustum, with a central longitudinal axis and defining an internal surface of the contamination trap, each vane comprising a first portion and a second portion,
wherein the first portion has a surface;
wherein the first portion has a vertex that extends away from the second portion and points toward the central longitudinal axis, wherein at least one vane comprises a material and a further material;
wherein the material and the further material form a diffusion layer;
wherein the material and the further material have substantially the same rate of thermal expansion and the material comprises a thermal conductivity that is greater than a thermal conductivity of the further material;
wherein the surface of the first portion comprises the further material; and
wherein the contamination trap is configured to trap fuel debris emitted from the plasma formation region.

19. A device manufactured according to the method of claim 18.

* * * * *

UNITED STATES PATENT AND TRADEMARK OFFICE
CERTIFICATE OF CORRECTION

PATENT NO. : 11,982,947 B2
APPLICATION NO. : 18/070155
DATED : May 14, 2024
INVENTOR(S) : Derks et al.

It is certified that error appears in the above-identified patent and that said Letters Patent is hereby corrected as shown below:

On the Title Page

Item (73), in "Assignee", Line 1, delete "NETHERLAND" and insert -- NETHERLANDS --, therefor.

In the Claims

In Column 17, Claim 5, Line 46, delete "m–1 K–1." and insert -- $m^{-1} K^{-1}$. --, therefor.

In Column 17, Claim 6, Line 49, delete "m–1 K–1." and insert -- $m^{-1} K^{-1}$. --, therefor.

In Column 17, Claim 7, Line 52, delete "m–1 K–1." and insert -- $m^{-1} K^{-1}$. --, therefor.

In Column 18, Claim 14, Line 32, delete "m–1 K–1." and insert -- $m^{-1} K^{-1}$. --, therefor.

Signed and Sealed this
Eighteenth Day of June, 2024

Katherine Kelly Vidal
*Director of the United States Patent and Trademark Office*